(12) United States Patent
Hudson

(10) Patent No.: US 12,045,090 B2
(45) Date of Patent: Jul. 23, 2024

(54) LAPTOP COMPUTER PLATFORM DEVICE

(71) Applicant: Cody Hudson, McHenry, MD (US)

(72) Inventor: Cody Hudson, McHenry, MD (US)

( * ) Notice: Subject to any disclaimer, the term of this patent is extended or adjusted under 35 U.S.C. 154(b) by 211 days.

(21) Appl. No.: 17/894,617

(22) Filed: Aug. 24, 2022

(65) Prior Publication Data

US 2024/0069599 A1 Feb. 29, 2024

(51) Int. Cl.
G06F 1/16 (2006.01)
G06F 1/20 (2006.01)
H05K 7/20 (2006.01)
F21V 33/00 (2006.01)

(52) U.S. Cl.
CPC .......... G06F 1/1632 (2013.01); G06F 1/203 (2013.01); H05K 7/20145 (2013.01); *F21V 33/0048* (2013.01)

(58) Field of Classification Search
CPC combination set(s) only.
See application file for complete search history.

(56) References Cited

U.S. PATENT DOCUMENTS

| | | | |
|---|---|---|---|
| 5,206,790 A | 4/1993 | Thomas | |
| 5,768,101 A * | 6/1998 | Cheng | G06F 1/203 361/679.55 |
| 6,396,687 B1 | 5/2002 | Sun | |
| 6,560,104 B2 | 5/2003 | DeHoff | |
| 7,106,585 B2 * | 9/2006 | Lin | G06F 1/1628 361/679.49 |
| 8,537,537 B2 * | 9/2013 | Tabasso | G06F 1/1632 361/679.48 |
| 8,630,088 B2 | 1/2014 | Collopy | |
| 9,143,719 B2 * | 9/2015 | Tamura | G06F 1/1632 |
| 9,429,994 B1 | 8/2016 | Vier | |
| 9,946,300 B2 | 4/2018 | Rosenberg | |
| 10,416,734 B2 * | 9/2019 | Casparian | G06F 1/1632 |
| 10,481,656 B2 * | 11/2019 | Casparian | G06F 1/1632 |
| 10,768,676 B2 * | 9/2020 | Liu | G06F 1/1632 |
| 11,092,986 B2 * | 8/2021 | North | G06F 1/203 |
| 11,347,285 B2 * | 5/2022 | Casparian | G06F 1/1632 |
| 11,755,081 B2 * | 9/2023 | Casparian | G06F 1/1632 165/80.2 |
| 2014/0043750 A1 * | 2/2014 | Calderone | G06F 1/203 361/679.41 |
| 2017/0168531 A1 * | 6/2017 | Casparian | G06F 1/206 |
| 2023/0014262 A1 * | 1/2023 | Wu | H02J 50/10 |
| 2023/0074238 A1 * | 3/2023 | Seth | H05K 7/20145 |
| 2024/0069599 A1 * | 2/2024 | Hudson | G06F 1/1632 |

* cited by examiner

Primary Examiner — Lisa Lea-Edmonds

(57) ABSTRACT

A laptop computer platform device for supporting a laptop on a platform for cooling, powering, and repositioning the laptop includes a housing with a top surface of a top wall of the housing being configured for supporting a laptop. The housing is rotatably coupled to a base which is configured for positioning the base on a support surface and pivotably positioning the laptop relative to the base. The housing contains a fan within a duct which urges a quantity of air through the duct, thereby cooling the laptop, when activated. A power module is contained by the housing which powers the fan and charges the laptop when the laptop is electrically coupled to the power module through an output charging port positioned on a perimeter wall of the housing.

16 Claims, 6 Drawing Sheets

US 12,045,090 B2

LAPTOP COMPUTER PLATFORM DEVICE

BACKGROUND OF THE INVENTION

(1) Field of the Invention

The disclosure relates to electronic device platforms and more particularly pertains to a new electronic device platform for supporting a laptop on a platform for cooling, powering, and repositioning the laptop.

(2) Description of Related Art Including Information Disclosed Under 37 CFR 1.97 and 1.98

The prior art relates to apparatuses which focus on one or two of the capabilities of the present invention. For example, some apparatuses will dock with an electronic device to charge it. The prior art discloses a docking apparatus which facilitates ergonomic electronic coupling of other electronic devices to the docked electronic device. Also disclosed is a docking apparatus to which a laptop couples that enhances the air circulation already present within the laptop by extending the ductwork and contributing another fan. Some apparatuses hold a docked electronic device in a repositionable manner by, for example pivoting the screen about a horizontal axis. However, the prior art does not combine the functions of repositionably supporting, powering, and cooling a laptop. More particularly, the prior art does not disclose a device that provides an extendable planar support surface for a laptop which is pivotably positionable about a vertical axis and which also cools the laptop through external air circulation while charging the laptop.

BRIEF SUMMARY OF THE INVENTION

An embodiment of the disclosure meets the needs presented above by generally comprising a housing with a top surface of a top wall of the housing being configured for supporting a laptop. The housing is rotatably coupled to a base which is configured for positioning the base on a support surface and pivotably positioning the laptop relative to the base. The housing contains a fan within a duct which urges a quantity of air through the duct, thereby cooling the laptop, when activated. A power module is contained by the housing which powers the fan and charges the laptop when the laptop is electrically coupled to the power module through an output charging port positioned on a perimeter wall of the housing.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
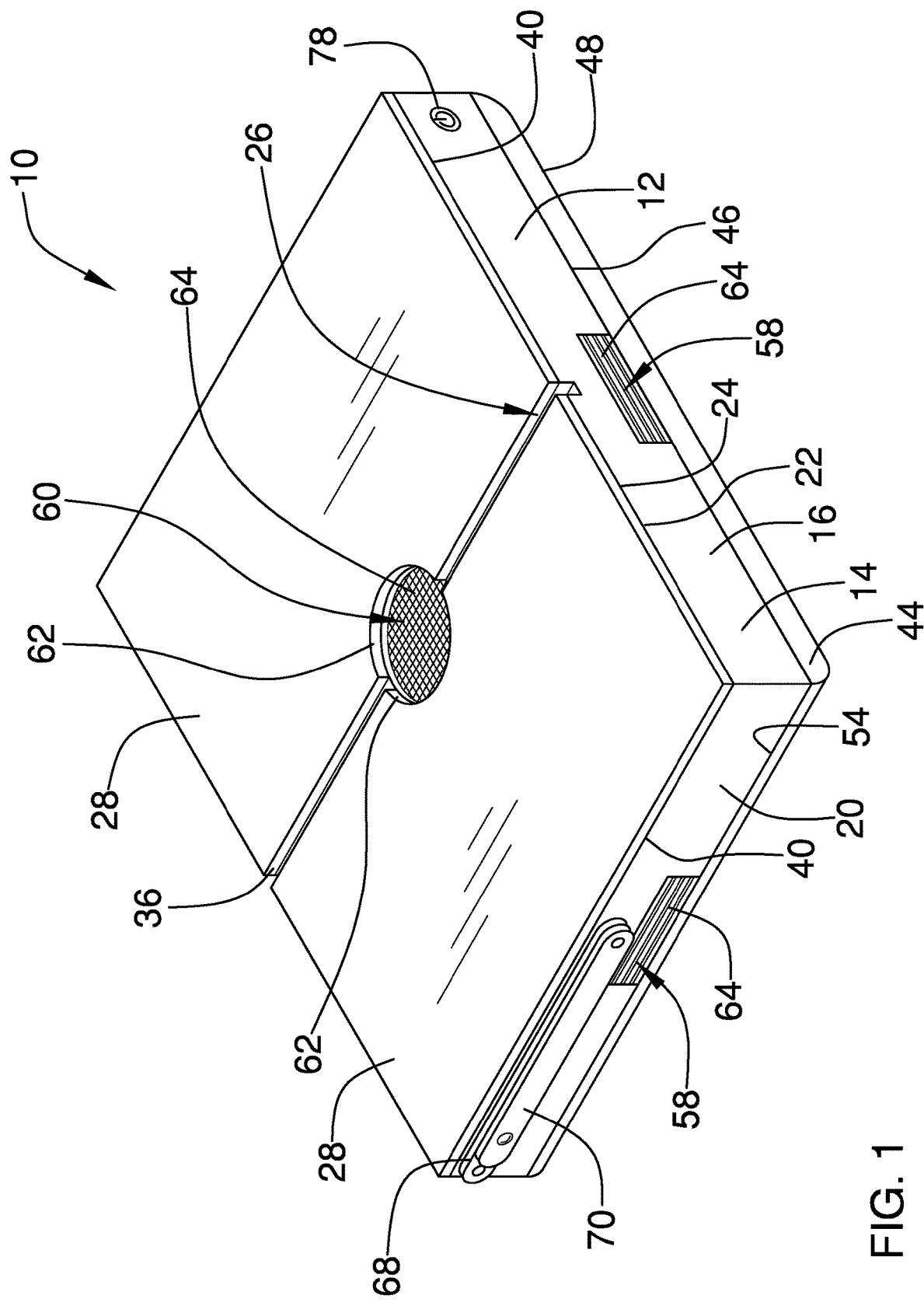
FIG. 1 is a front top side perspective view of a laptop computer platform device according to an embodiment of the disclosure.
Figure 2:
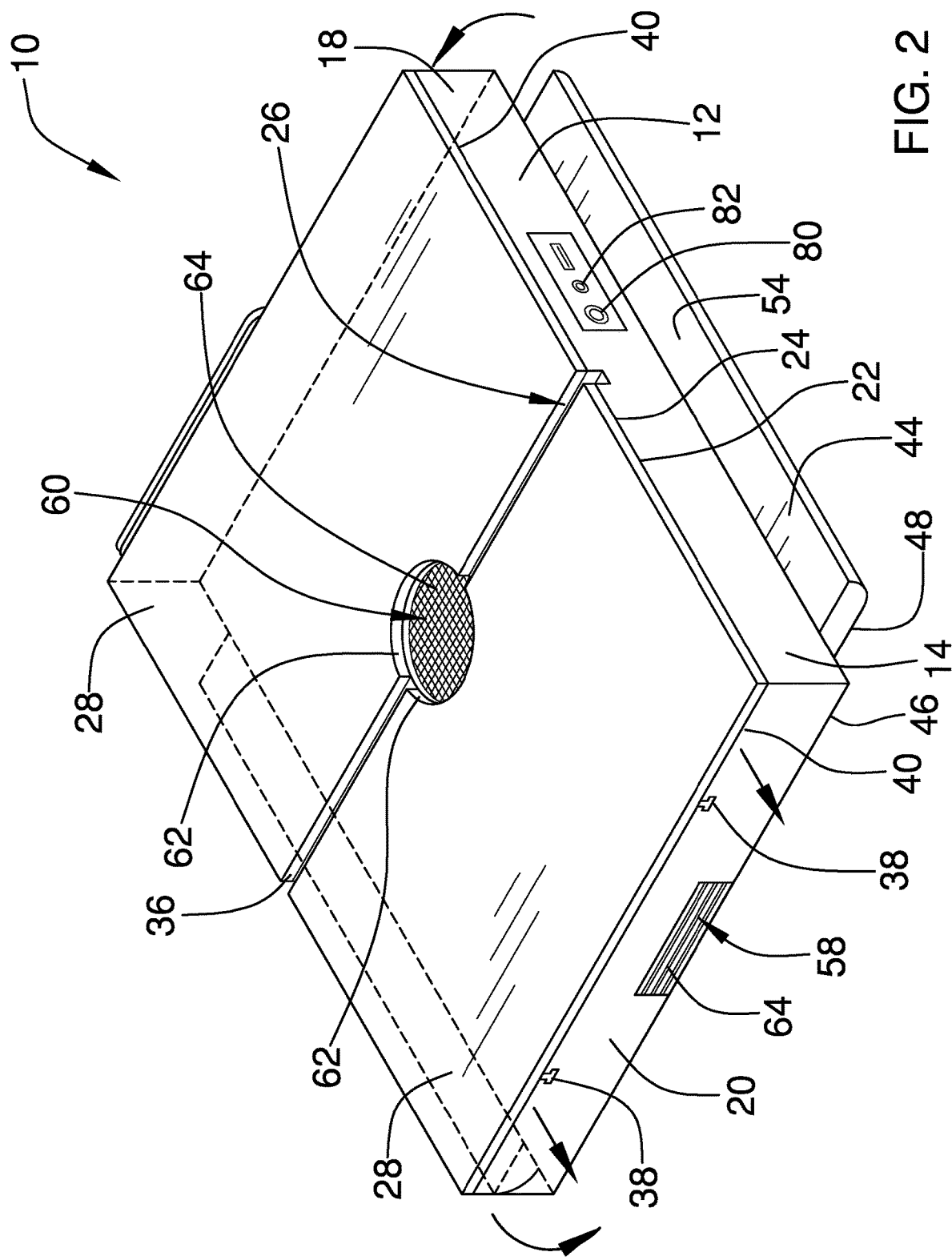
FIG. 2 is a rear top side perspective view of an embodiment of the disclosure wherein the housing is pivoted about the base.
Figure 3:
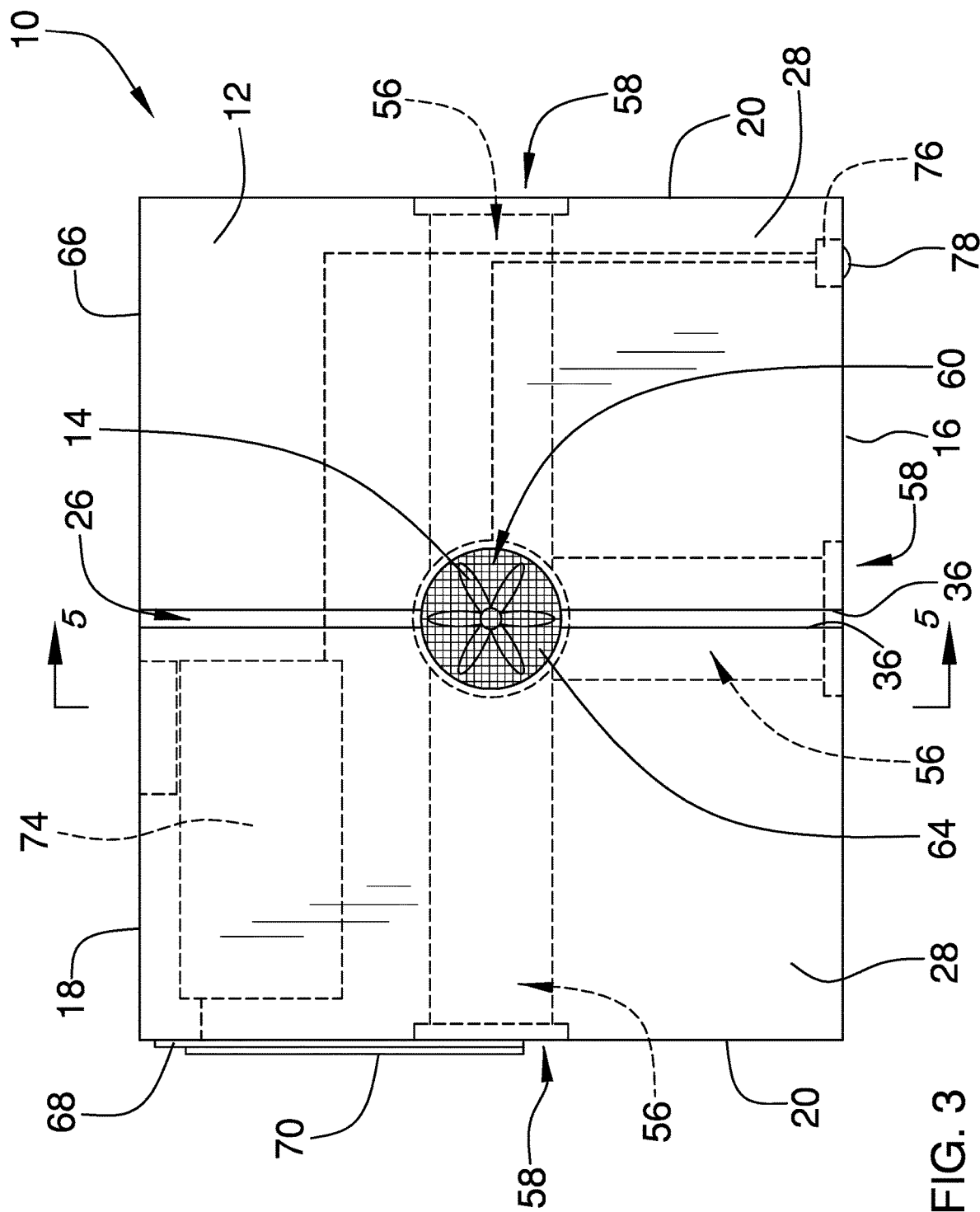
FIG. 3 is a top view of an embodiment of the disclosure.
Figure 4:
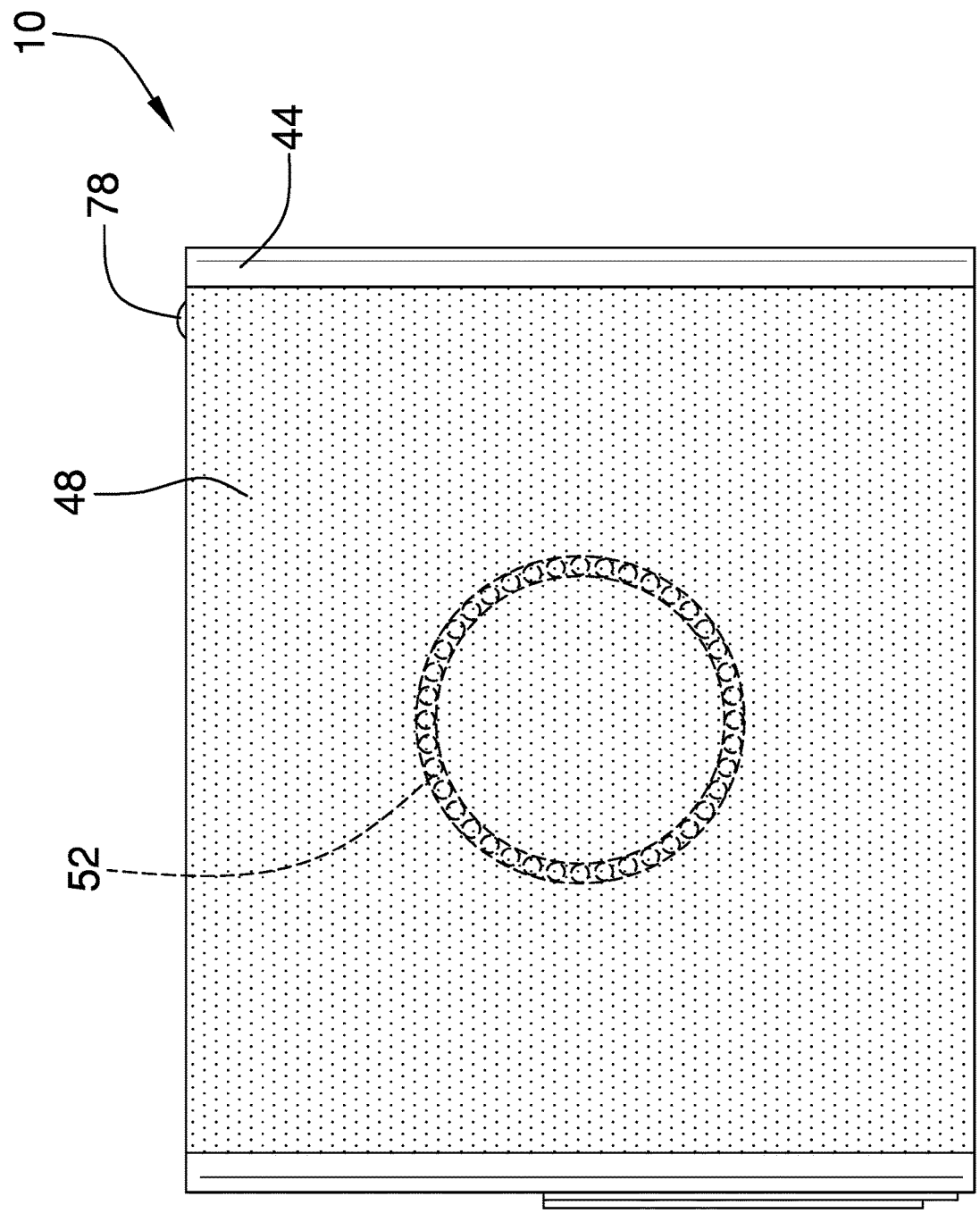
FIG. 4 is a bottom view of an embodiment of the disclosure.
Figure 5:
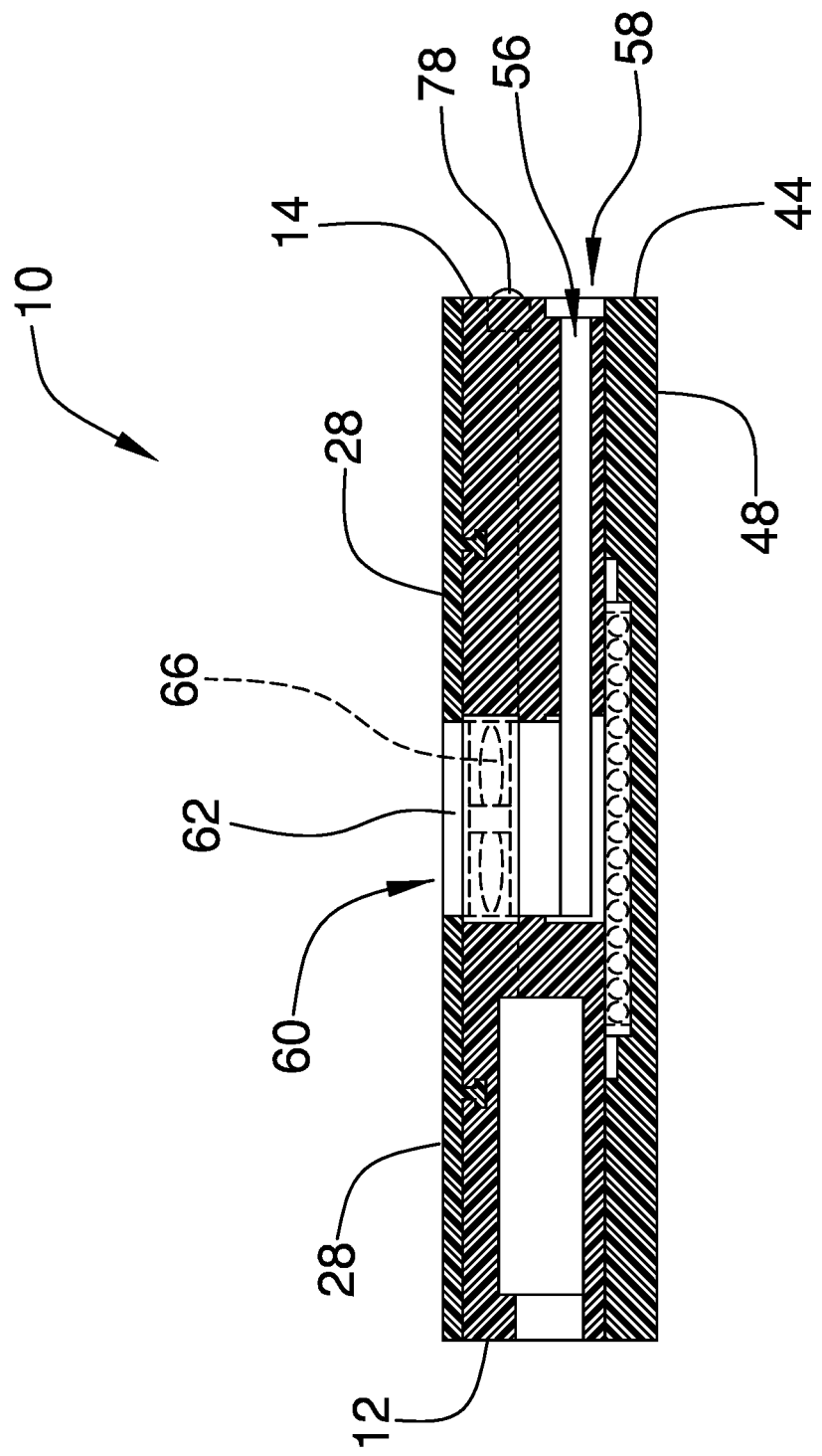
FIG. 5 is a cross-sectional view of an embodiment of the disclosure from arrows 5-5 in FIG. 3.
Figure 6:
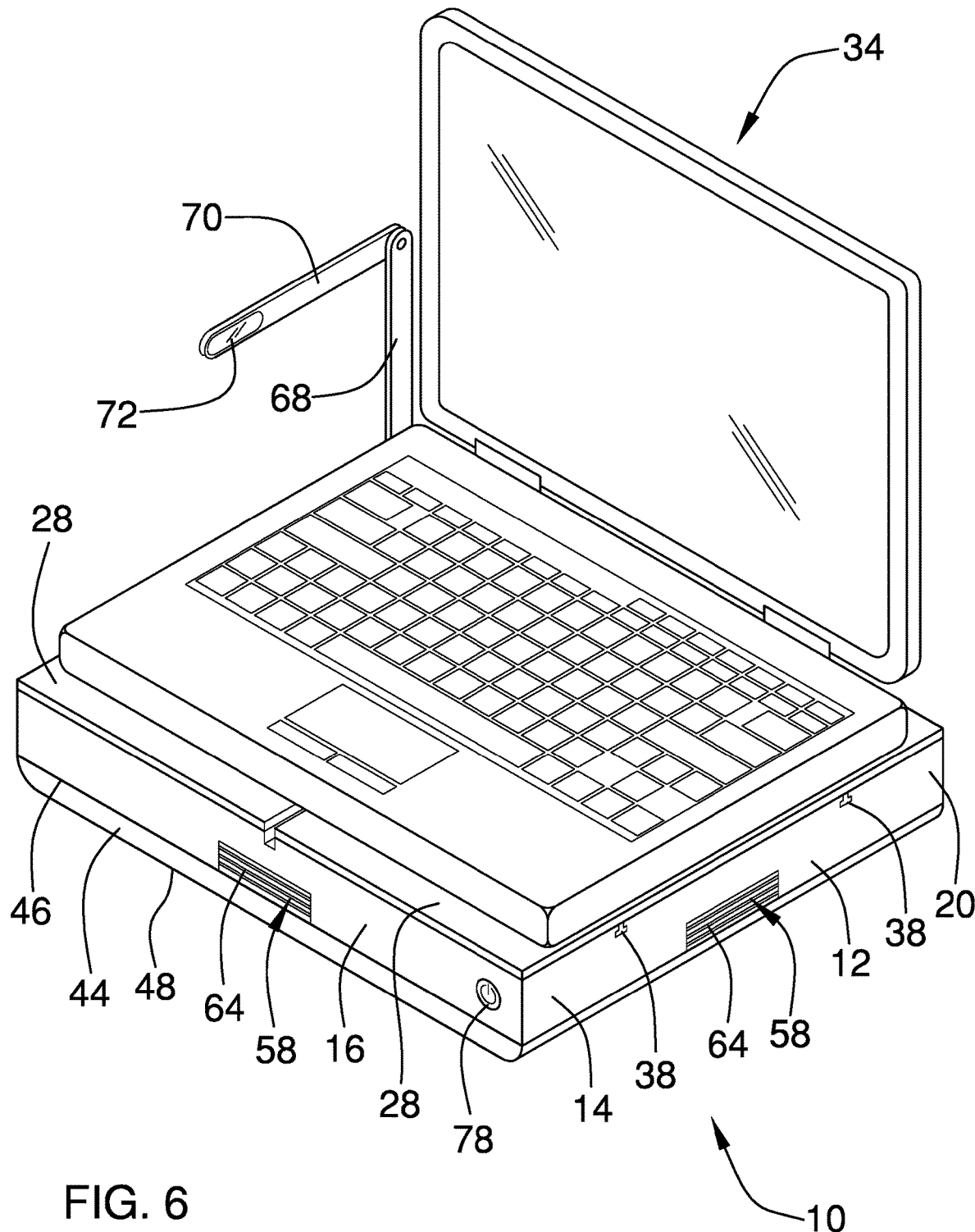
FIG. 6 is an in-use view of an embodiment of the disclosure.

With reference now to the drawings, and in particular to FIGS. 1 through 6 thereof, a new electronic device platform embodying the principles and concepts of an embodiment of the disclosure and generally designated by the reference numeral 10 will be described.

As best illustrated in FIGS. 1 through 6, the laptop computer platform device 10 generally comprises a housing 12 with a perimeter wall 14, wherein the perimeter wall 14 has a front segment 16, a back segment 18, and a pair of lateral segments 20. The housing 12 is elongated along a central longitudinal axis from the front segment 16 to the back segment 18. The housing 12 has a top surface 24 of a top wall 22, wherein the housing 12 has a groove 26 in the top surface 24 of the top wall 22 extending along a central axis of the top surface 24 parallel to the central longitudinal axis.

A pair of platforms 28 is slidably coupled to the top surface 24, wherein each platform 28 is slidable laterally relative to the housing 12. Each platform 28 is movable between a retracted position and an extended position, and each platform 28 is configured for supporting a laptop 34. Each platform 28 extends in one of a pair of opposite directions away from the other platform 28. Each platform 28 has an inner end 36 adjacent to the groove 26 in the top surface 24 of the top wall 22 when the platform 28 is in the retracted position. Each platform 28 has a plurality of T-shaped runners 38 protruding from a bottom end 40 of the platform 28 which are each complementary in shape to each of a plurality of notches in the top surface 24 of the top wall 22 of the housing 12. Alternatively, the laptop computer platform device 10 may not comprise a pair of platforms 28 coupled to the top surface 24 of the top wall 22 of the housing 12.

A base 44 is rotatably coupled to a bottom surface 46 of the housing 12. The base 44 has a bottom side 48 of the base 44 constructed of a non-slip material and configured for positioning on a support surface. The base 44 is configured for rotatably positioning the laptop 34 relative to the support surface. A turntable bearing 52 is coupled to a top side 54 of the base 44 and a bottom surface 46 of the housing 12 which rotatably couples the base 44 to the housing 12.

A plurality of ducts 56 is positioned within the housing 12, wherein each duct 56 is in communication with an exterior atmosphere through each of a plurality of vents. The plurality of vents comprise a plurality of perimeter vents 58 in the perimeter wall 14 of the housing 12 and a top vent 60 in the top wall 22 of the housing 12, each duct 56 extending from the top vent 60 to an associated perimeter vent 58. The top vent 60 is positioned centrally on the top surface 24 of the top wall 22 of the housing 12 and is circular. Each platform 28 has a curved cutout 62 in the inner end 36 which has a radius equal to a radius of the top vent 60, and each curved cutout 62 is adjacent to the top vent 60 when the associated platform 28 is in the retracted position. The plurality of perimeter vents 58 comprises a front vent in the front segment 16 of the perimeter wall 14 and each of a pair of lateral vents positioned in each of the pair of lateral segments 20 of the perimeter wall 14. Each perimeter vent 58 is rectangular.

Each of a plurality of vent covers 64 is positioned within an associated one of each vent. Each vent cover 64 has a plurality of apertures and is configured to permit the quantity of air through each associated vent while blocking a debris from passing through each associated vent. A fan 66 is positioned in the plurality of ducts 56 adjacent the top vent 60 and is configured for selectively urging a quantity of air from the exterior atmosphere through each duct 56 and returning to the atmosphere.

The laptop computer platform device 10 may alternatively have a single duct 56 extending between the top vent 60 and a single perimeter vent 58. Additionally, the top vent 60 may not be circular, the top vent 60 may not be centrally positioned, and each perimeter vent 58 may not be rectangular. The laptop computer platform device 10 may not comprise a plurality of vent covers 64.

A first lamp arm 68 is pivotably coupled to one of the pair of lateral segments 20 of the perimeter wall 14 proximate to the back segment 18 of the perimeter wall 14 and is pivotable about a first pivoting axis perpendicular to a central vertical plane of the housing 12. A second lamp arm 70 is pivotably coupled to the first lamp arm 68 proximate a distal end of the first lamp arm 68 relative to the first pivoting axis and is pivotable about a second pivoting axis perpendicular to the central vertical plane of the housing 12. A lamp 72 is coupled to a distal end of the second lamp arm 70 relative to the second pivoting axis and is configured to selectively emit a light. The lamp 72 is configured to be cooperatively positionable with the first lamp arm 68 and the second lamp arm 70 such that the lamp 72 emits the light onto the laptop 34 when the lamp 72 is activated while the laptop 34 is positioned on one of the pair of platforms 28.

A power module 74 is positioned in the housing 12 and comprises a rechargeable battery. A switch 76 is positioned within the housing 12 and is operationally coupled to the power module 74, the fan 66, and the lamp 72. The switch 76 is movable between an on position and an off position, wherein the fan 66 and the lamp 72 are electrically coupled to the power module 74 when the switch 76 is in the on position and are electrically decoupled from the power module 74 when the switch 76 is in the off position. The fan 66 and the lamp 72 activate when electrically coupled to the power module 74. A button 78 is positioned on the front segment 16 of the perimeter wall 14 which is depressible. The button 78 is operationally coupled to the switch 76 and moves the switch 76 to the on position when the button 78 depresses while the switch 76 is in the off position. The button 78 moves the switch 76 to the off position when the button 78 depresses while the switch 76 is in the on position.

An output charging port 80 is positioned on the back segment 18 of the perimeter wall 14 and is electrically coupled to the power module 74. The output charging port 80 is configured to electrically couple to the laptop 34 and to charge the laptop 34 when the laptop 34 is electrically coupled to the output charging port 80. An input charging port 82 is also positioned on the back segment 18 of the perimeter wall 14 proximate the output charging port 80 and is electrically coupled to the power module 74. The input charging port 82 is configured to electrically couple to an external power source and to receive a charge from the external power source when the external power source is electrically coupled to the input charging port 82.

In use, the laptop computer platform device 10 is placed on a support surface such as a lap, a table, or a desk. Each platform 28 is slidably moved to a desired position and the laptop 34 is placed atop one or more of the platforms 28. The button 78 is depressed while the switch 76 is in the off position to move the switch 76 to an on position, thereby coupling the power module 74 to the fan 66 and the lamp 72 and activating the fan 66 and the lamp 72. The fan 66 urges a quantity of air through each duct 56, which cools the laptop 34 when the laptop 34 is placed over the top vent 60 due to the laptop 34 being adjacent a path of the quantity of air. The lamp 72 emits a light. The lamp 72 may be positioned to emit light onto the laptop 34 by moving the first lamp arm 68 and the second lamp arm 70. To charge the laptop 34, the laptop 34 may be electrically coupled to the output charging port 80, whereby the power module 74 charges the laptop 34. To charge the power module 74, an external power source may be electrically coupled to the input charging port 82.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:
1. A laptop computer platform device comprising:
a housing, said housing having a perimeter wall, said perimeter wall having a front segment, a back segment, and a pair of lateral segments, said housing being elongated along a central longitudinal axis from said front segment to said back segment, said housing having a top surface of a top wall configured for supporting a laptop;
a base, said base being rotatably coupled to a bottom surface of said housing, said base having a bottom side of said base configured for positioning on a support surface, said base being configured for rotatably positioning the laptop relative to the support surface;
a duct positioned within said housing, said duct being in communication with an exterior atmosphere through a plurality of vents, said plurality of vents comprising a perimeter vent in said perimeter wall of said housing and a top vent in said top wall of said housing;

a fan, said fan being positioned in said duct, said fan being configured for selectively urging a quantity of air from said exterior atmosphere through said duct and returning to said atmosphere;

a power module, said power module being positioned in said housing;

a switch, said switch being positioned within said housing, said switch being operationally coupled to said power module and said fan, said switch being movable between an on position and an off position, said fan being electrically coupled to said power module when said switch is in said on position, said fan being electrically decoupled from said power module when said switch is in said off position, said fan activating when electrically coupled to said power module; and an output charging port, said output charging port being positioned on said perimeter wall of said housing, said output charging port being electrically coupled to said power module, said output charging port being configured to electrically couple to the laptop, said power module being configured to charge the laptop when the laptop is electrically coupled to said output charging port.

2. The device of claim 1, wherein said duct is one of a plurality of ducts, said perimeter vent being one of a plurality of perimeter vents, each said duct extending from said top vent to an associated perimeter vent, said fan being positioned adjacent said top vent, said fan being configured to selectively urge the quantity of air through each said duct.

3. The device of claim 2, wherein said top vent is positioned centrally on said top surface of said top wall of said housing, said plurality of perimeter vents comprising a front vent in said front segment of said perimeter wall and a pair of lateral vents, each said lateral vent being positioned in each of said pair of lateral segments of said perimeter wall.

4. The device of claim 3, further comprising a plurality of vent covers, each said vent cover being positioned within an associated one of each said vent, each said vent cover having a plurality of apertures, each said vent cover being configured to permit the quantity of air through each said vent, each said vent cover being configured to block a debris from passing through each said associated vent.

5. The device of claim 1, further comprising a platform slidably coupled to said top surface of said top wall of said housing, said platform being slidable laterally relative to said housing, said platform being movable between a retracted position and an extended position, said platform being configured for supporting a laptop.

6. The device of claim 5, wherein said platform is one of a pair of platforms slidably coupled to said top surface, each said platform being slidable laterally relative to said housing, each said platform being movable between a retracted position and an extended position, each said platform being configured for supporting a laptop, each platform extending in one of a pair of opposite directions away from said other platform.

7. The device of claim 6, wherein each said platform has a plurality of T-shaped runners protruding from a bottom end of said platform, said top surface of said top wall of said housing having a plurality of notches, each said notch being complementary in shape to an associated runner of said pair of platforms.

8. The device of claim 6, further comprising:

a first lamp arm, said first lamp arm being pivotably coupled to one of said pair of lateral segments of said perimeter wall, said first lamp arm being pivotable about a first pivoting axis perpendicular to a central vertical plane of said housing, said central vertical plane being coplanar with said central longitudinal axis of said housing;

a second lamp arm, said second lamp arm being pivotably coupled to said first lamp arm proximate a distal end of said first lamp arm relative to said first pivoting axis, said second lamp arm being pivotable about a second pivoting axis perpendicular to said central vertical plane of said housing; and a lamp, said lamp being coupled to a distal end of said second lamp arm relative to said second pivoting axis, said lamp being configured to selectively emit a light, said switch being operationally coupled to said power module, said fan, and said lamp, said light being electrically coupled to said power module when said switch is in said on position, said light being electrically decoupled from said power module when said switch is in said off position, said light activating when electrically coupled to said power module, said lamp being configured to be cooperatively positionable with said first lamp arm and said second lamp arm such that said lamp emits the light onto the laptop when said lamp is activated while the laptop is positioned on one of said pair of platforms.

9. The device of claim 1, further comprising an input charging port, said input charging port being positioned on said perimeter wall of said housing, said input charging port being electrically coupled to said power module, said input charging port being configured to electrically couple to an external power source, said power module being configured to receive a charge from the external power source when the external power source is electrically coupled to said input charging port.

10. The device of claim 9, wherein said input charging port is a universal serial bus port.

11. The device of claim 1, wherein said power module comprises a rechargeable battery.

12. The device of claim 1, further comprising a button, said button being positioned on said perimeter wall, said button being depressible, said button being operationally coupled to said switch, said button moving said switch to said on position when said button depresses while said switch is in said off position, said button moving said switch to said off position when said button depresses while said switch is in said on position.

13. The device of claim 1, further comprising a turntable bearing, said turntable bearing being coupled to a top side of said base and a bottom surface of said housing, said turntable bearing rotatably coupling said base to said housing.

14. The device of claim 1, wherein said output charging port is a universal serial bus port.

15. The device of claim 1, wherein said bottom side of said base is constructed of a non-slip material.

16. A laptop computer platform device comprising:

a housing, said housing having a perimeter wall, said perimeter wall having a front segment, a back segment, and a pair of lateral segments, said housing being elongated along a central longitudinal axis from said front segment to said back segment, said housing having a top surface of a top wall, wherein said housing has a groove in said top surface of said top wall extending along a central axis of said top surface parallel to said central longitudinal axis;

a pair of platforms, said pair of platforms being slidably coupled to said top surface, each said platform being slidable laterally relative to said housing, each said platform being movable between a retracted position and an extended position, each said platform being configured for supporting a laptop, each platform extending in one of a pair of opposite directions away from said other platform,
- wherein each said platform has an inner edge adjacent to said groove in said top surface of said top wall when said platform is in said retracted position,
- wherein each said platform has a plurality of T-shaped runners protruding from a bottom end of said platform, said top surface of said top wall of said housing having a plurality of notches, each said notch being complementary in shape to an associated runner of said pair of platforms;

a base, said base being rotatably coupled to a bottom surface of said housing, said base having a bottom side of said base configured for positioning on a support surface, said bottom side of said base being constructed of a non-slip material, said base being configured for rotatably positioning the laptop relative to the support surface;

a turntable bearing, said turntable bearing being coupled to a top side of said base and a bottom surface of said housing, said turntable bearing rotatably coupling said base to said housing;

a plurality of ducts, said plurality of ducts being positioned within said housing, each said duct being in communication with an exterior atmosphere through each of a plurality of vents, said plurality of vents comprising a plurality of perimeter vents in said perimeter wall of said housing and a top vent in said top wall of said housing, each said duct extending from said top vent to an associated perimeter vent,
- wherein said top vent is positioned centrally on said top surface of said top wall of said housing, said top vent being circular, each said platform having a curved cutout in said inner edge, each said curved cutout having a radius equal to a radius of said top vent, each said curved cutout being adjacent to said top vent when said associated platform is in said retracted position,
- wherein said plurality of perimeter vents comprises a front vent in said front segment of said perimeter wall and a pair of lateral vents, each said lateral vent being positioned in each of said pair of lateral segments of said perimeter wall, each said perimeter vent being rectangular;

a plurality of vent covers, each said vent cover being positioned within an associated one of each said vent, each said vent cover having a plurality of apertures, each said vent cover being configured to permit the quantity of air through each said vent, each said vent cover being configured to block a debris from passing through each said associated vent;

a fan, said fan being positioned in said plurality of ducts adjacent said top vent, said fan being configured for selectively urging a quantity of air from said exterior atmosphere through each said duct and returning to said atmosphere;

a first lamp arm, said first lamp arm being pivotably coupled to one of said pair of lateral segments of said perimeter wall proximate to said back segment of said perimeter wall, said first lamp arm being pivotable about a first pivoting axis perpendicular to a central vertical plane of said housing;

a second lamp arm, said second lamp arm being pivotably coupled to said first lamp arm proximate a distal end of said first lamp arm relative to said first pivoting axis, said second lamp arm being pivotable about a second pivoting axis perpendicular to said central vertical plane of said housing;

a lamp, said lamp being coupled to a distal end of said second lamp arm relative to said second pivoting axis, said lamp being configured to selectively emit a light, said lamp being configured to be cooperatively positionable with said first lamp arm and said second lamp arm such that said lamp emits the light onto the laptop when said lamp is activated while the laptop is positioned on one of said pair of platforms;

a power module, said power module being positioned in said housing, wherein said power module comprises a rechargeable battery;

a switch, said switch being positioned within said housing, said switch being operationally coupled to said power module, said fan, and said lamp, said switch being movable between an on position and an off position, said fan and said lamp being electrically coupled to said power module when said switch is in said on position, said fan and said lamp being electrically decoupled from said power module when said switch is in said off position, said fan and said lamp activating when electrically coupled to said power module;

a button, said button being positioned on said front segment of said perimeter wall, said button being depressible, said button being operationally coupled to said switch, said button moving said switch to said on position when said button depresses while said switch is in said off position, said button moving said switch to said off position when said button depresses while said switch is in said on position;

an output charging port, said output charging port being positioned on said back segment of said perimeter wall, said output charging port being electrically coupled to said power module, said output charging port being configured to electrically couple to the laptop, said power module being configured to charge the laptop when the laptop is electrically coupled to said output charging port; and an input charging port, said input charging port being positioned on said back segment of said perimeter wall proximate said output charging port, said input charging port being electrically coupled to said power module, said input charging port being configured to electrically couple to an external power source, said power module being configured to receive a charge from the external power source when the external power source is electrically coupled to said input charging port.

* * * * *